(12) United States Patent
Raghunathan et al.

(10) Patent No.: US 7,973,612 B2
(45) Date of Patent: Jul. 5, 2011

(54) SUPPLY-REGULATED PHASE-LOCKED LOOP (PLL) AND METHOD OF USING

(75) Inventors: Ashwin Raghunathan, Santa Clara, CA (US); Marzio Pedrali-Noy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 75 days.

(21) Appl. No.: 12/430,104

(22) Filed: Apr. 26, 2009

(65) Prior Publication Data

US 2010/0271140 A1    Oct. 28, 2010

(51) Int. Cl.
*H03L 7/099* (2006.01)
(52) U.S. Cl. ............. 331/186; 331/185; 331/34; 331/74
(58) Field of Classification Search .................. 331/186, 331/185, 34, 74
See application file for complete search history.

(56) References Cited

U.S. PATENT DOCUMENTS

| | | | |
|---|---|---|---|
| 5,912,574 A | 6/1999 | Bhagwan | |
| 6,313,615 B1 | 11/2001 | Fayneh et al. | |
| 6,504,438 B1 | 1/2003 | Chang et al. | |
| 6,928,128 B1 | 8/2005 | Sidiropoulos | |
| 7,095,288 B2* | 8/2006 | Smith | 331/74 |
| 7,372,320 B2* | 5/2008 | Pan | 327/541 |
| 7,602,260 B1* | 10/2009 | Atesoglu | 331/186 |
| 2002/0000886 A1* | 1/2002 | Ichihara | 331/57 |
| 2003/0206066 A1* | 11/2003 | Harwood | 331/17 |
| 2008/0111646 A1* | 5/2008 | Nair | 331/185 |

OTHER PUBLICATIONS

E. Alon et al., "Replica Compensated Linear Regulators for Supply Regulated Phase Locked Loops," IEEE J. Solid State Circuits, vol. 41, pp. 413-424, Feb. 2006.
Gang Yan et al., "A Self-Biased PLL with Current-Mode Filter for Clock Generation," ISSCC Dig. Tech. Papers, pp. 420-421, Feb. 2005.
International Search Report and Written Opinion—PCT/US2010/032456, International Search Authority—European Patent Office—Jul. 27, 2010.
J. G. Maneatis et al., "Low-Jitter Process-Independent PLL and DLL Based on Self-Biased Techniques," IEEE J. Solid State Circuits, vol. 31, pp. 1723-1732, Nov. 1996.
J. G. Maneatis et al., "Self-Biased High-Bandwidth Low-Jitter 1-to-4096 Multiplier Clock Generator PLL," IEEE J. Solid State Circuits, pp. 1795-1803, Nov. 2003.
S. Sidiropoulos et al, "Adaptive bandwidth DLLs and PLLs using regulated supply CMOS buffers" 2000 Symposium on VLSI Circuits Dig. Tech. Papers, pp. 124-127, Jun. 2000.
Woo Young Jung et al., "A 1.2mW 0.02mm2 2GHz Current-Controlled PLL Based on a Self-Biased Voltage-to-Current Converter," ISSCC Dig. Tech. Papers, pp. 310-605, Feb. 2007.

* cited by examiner

*Primary Examiner* — Joseph Chang
(74) *Attorney, Agent, or Firm* — Eric Ho

(57) ABSTRACT

A supply-regulated Phase-locked loop (PLL) is provided. The PLL comprises a supply-regulating loop, a voltage-controlled oscillator (VCO), and a programmable decoupling capacitor array for the VCO. The capacitance of the VCO decoupling capacitor array is adjustable to be equal to N times $C_{UNIT}$, where N is the current value of a multiplication factor of a divide-by-N circuit and $C_{UNIT}$ is a unit capacitance characterized for a processing technology chosen for fabricating the decoupling capacitor array. When the PLL switches from one frequency band to another, a higher-order pole introduced by the VCO decoupling capacitor tracks the PLL reference frequency, thus improving the PLL operational stability.

28 Claims, 5 Drawing Sheets

SUPPLY-REGULATED PHASE-LOCKED LOOP (PLL) AND METHOD OF USING

TECHNICAL FIELD

The present invention relates generally to phase-locked loops, and more particularly to a supply-regulated PLL and method of using.

BACKGROUND

A phase-locked loop (PLL) is an electronic system that locks in phase and frequency of an output signal to the phase and frequency of an input signal. A PLL is widely used in applications in communication systems and devices, such as FM demodulators, stereo demodulators, tone detectors, frequency synthesizers, etc. A PLL is also commonly employed in digital applications that require a high-frequency periodic signal to synchronize the events between high-performance digital circuits, such as microprocessors, digital signal processors, network processors, synchronous systems, and the like. A PLL is particularly desirable to be integrated with semiconductor integrated circuits (IC) for the various application fields, and implemented by advanced Very-Large-Scale-Integrated-Circuit (VLSI) manufacturing technologies, such as a Complementary Metal-Oxide-Semiconductor (CMOS) manufacturing technology.

As the trend of integrating a complex electronic system on a monolithic semiconductor chip continues, PLLs have become an essential component for nearly all VLSI chips. As an example, a PLL is typically integrated in an advanced digital system, such as a microprocessor to provide synchronized clock signals, among other things. As another example, a PLL is also typically employed in an analog or a mixed-signal chip, such as a high-performance radio frequency (RF) transceiver, to form a frequency synthesizer, which is generally used to modulate a baseband signal in a transmitter and demodulate an incoming RF signal in a receiver. Robust and stable operation is one of the most desirable characteristics of a PLL, determining the overall performance of the circuitry it is integrated with.

While CMOS manufacturing technologies continue scaling down into the deep-submicron and nanometer range, design of PLLs with desirable characteristics is becoming increasingly difficult. One of the many challenges comes from increased sensitivity to on-chip power supply noise due to the reduced supply-to-threshold voltage ratios, which degrades PLL performance, by causing increased phase noise or timing jitter. More specifically, a voltage controlled oscillator (VCO) or a current controlled oscillator (CCO) used in a PLL is particularly sensitive to noise on its power supply. It is essential that the VCO or CCO operates from a "clean" power supply for an advanced PLL architecture.

A supply-regulated PLL architecture is used to provide a clean or regulated supply to the VCO or CCO used in a PLL. As an example, a typical supply-regulated PLL architecture involves using a supply-regulating loop between the loop filter and voltage controlled oscillator (VCO) of a PLL. Such a supply-regulating loop may amplify and buffer the voltage control signal ($V_{CTRL}$) from the loop filter and generate an adjustable regulated power supply voltage to the VCO ($V_{REG}$). The main PLL loop operates the VCO at the required frequency by varying $V_{CTRL}$ and hence $V_{REG}$ and the supply-regulating loop keeps $V_{REG}$ independent of variations in the PLL power supply ($V_{DD}$). The existing supply-regulated PLLs having a configuration described above also typically include a decoupling capacitor between the regulated VCO supply voltage ($V_{REG}$) and the ground as an effort to eliminate the undesirable AC components in the regulated VCO supply voltage ($V_{REG}$).

This and other existing supply-regulated PLL structures, however, exhibit a number of apparent problems. First, as the supply-regulating loop itself does not reject VCO power supply noise at frequencies above its bandwidth, the bandwidth of the supply-regulating loop needs to be maximized. This may lead to increased power consumption in the PLL. Second, the use of the VCO decoupling capacitor introduces a higher-order pole which makes compensating the PLL loop difficult. It is desirable to ensure stable PLL operation across a wide range of reference frequencies. For this reason, it is important that the PLL loop dynamics track the reference frequency ($\omega_{WREF}$) while remaining independent of process, voltage and temperature (PVT) variations. In other words, the frequency of any higher order pole should scale with the PLL reference frequency but this is not always the case. Typically, the pole frequency-to-reference frequency ratio varies according to PVT conditions and can also be a function of the multiplication factor of the divide-by-N circuit used in the PLL. Hence, the operational stability of a supply-regulated PLL may be significantly reduced across PVT conditions and PLL usage may be limited to a narrow range of reference frequencies.

In view of these and other problems in the existing supply-regulated PLL structures, there is a need for improved supply-regulated PLL structures and methods of using in order to obtain the desired PLL characteristics while coping with the trend of continuous scaling of VLSI processing technology.

SUMMARY OF THE INVENTION

These and other problems are generally solved or circumvented, and technical advantages are generally achieved, by preferred embodiments of the present invention which provide a supply-regulated PLL. The PLL comprises a supply-regulating loop, a voltage-controlled oscillator (VCO), and a programmable decoupling capacitor array for the VCO. The capacitance of the VCO decoupling capacitor array is adjustable to be equal to N time $C_{UNIT}$, where N is the current value of a multiplication factor of a divide-by-N circuit and $C_{UNIT}$ is a unit capacitance characterized for a processing technology chosen for fabricating the decoupling capacitor array. When the PLL switches from one frequency band to another, a higher-order pole introduced by the VCO decoupling capacitor tracks the PLL reference frequency, thus maintaining the PLL operational stability across a wide range of reference frequencies. Also, the ratio of higher-order pole frequency to the PLL reference frequency is determined solely by a ratio of capacitances which is generally immune to PVT variations in modern process technologies. As a result, the operational stability of the supply-regulated PLL is now less sensitive to PVT variations and the PLL can be used with a wider range of reference frequencies.

In accordance with a preferred embodiment of the present invention, a PLL circuit comprises a supply regulator configured to generate a regulated control voltage to a voltage-controlled oscillator (VCO), the VCO generating a VCO output frequency in response to the regulated control voltage. The PLL circuit also comprises a divide-by-N circuit configured to feedback a divided portion of the VCO output frequency to a phase detector, the divide-by-N circuit having a multiplication factor of N. The PLL circuit further comprises a decoupling capacitor coupled to the regulated control voltage, the capacitance of the decoupling capacitor being equal to N times $C_{UNIT}$, wherein $C_{UNIT}$ represents a unit capacitance characterized for a processing technology chosen for fabricating the decoupling capacitance.

In accordance with another preferred embodiment of the present invention, a supply-regulated PLL circuit comprises a supply-regulated loop configured to generate a regulated supply voltage at a first node. The supply-regulated PLL circuit also comprises a voltage-to-current unit configured to generate a control current at a second node in response to the regulated supply voltage. The supply-regulated PLL circuit further comprises a current-controlled oscillator configured to generate an output frequency signal in response to the control current. The supply-regulated PLL circuit even further comprises a divide-by-N circuit configured to feedback a divided portion of the output frequency signal to a phase detector, the divide-by-N circuit having a multiplication factor of N. The supply-regulated PLL circuit additionally comprises a decoupling capacitor coupled between the second node and a ground, the capacitance of the decoupling capacitor being equal to N times $C_{UNIT}$, wherein $C_{UNIT}$ represents a unit capacitance characterized for a processing technology chosen for fabricating the decoupling capacitance.

In accordance with a further preferred embodiment of the present invention, a method of using a phase-locked loop (PLL) circuit comprises selecting a first multiplication factor N1 for a divide-by-N circuit in the PLL, setting the capacitance of a decoupling capacitor for a voltage controlled oscillator (VCO) to be equal to N1 times $C_{UNIT}$, selecting a second multiplication factor N2 for a divide-by-N circuit in the PLL, and adjusting the capacitance of the decoupling capacitor for the VCO to be equal to N2 times $C_{UNIT}$, wherein $C_{UNIT}$ represents a unit capacitance characterized for a processing technology chosen for fabricating the decoupling capacitance.

In accordance with an even further preferred embodiment of the present invention, a supply-regulated phase-locked loop (PLL) circuit comprises means for selecting a first multiplication factor N1 for a divide-by-N circuit in the PLL, means for setting the capacitance of a decoupling capacitor for a voltage controlled oscillator (VCO) to be equal to N1 times $C_{UNIT}$, means for selecting a second multiplication factor N2 for a divide-by-N circuit in the PLL, and means for adjusting the capacitance of the decoupling capacitor for the VCO to be equal to N2 times $C_{UNIT}$, wherein $C_{UNIT}$ represents a unit capacitance characterized for a processing technology chosen for fabricating the decoupling capacitance.

In accordance with an even further preferred embodiment of the present invention, a wireless device comprises a processor, memory in electronic communication with the processor, and instructions stored in the memory, the instruction being executable by the processor to select a first frequency band in the supply-regulated PLL, select a first multiplication factor N1 for a divide-by-N circuit in the PLL, and set the capacitance of a decoupling capacitor for a voltage controlled oscillator (VCO) to be equal to N1 times $C_{UNIT}$, wherein $C_{UNIT}$ represents a unit capacitance characterized for a processing technology chosen for fabricating the decoupling capacitance.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely supply-regulated PLLs with a PVT and multiplication factor independent higher order pole that tracks the PLL reference frequency, therefore providing an improved overall PLL operational stability, among other advantageous features. These advantageous features may be particularly desirable in a PLL used as a general purpose clock multiplier, for example. Embodiments of the present invention may be applied to PLLs used in applications where improved operational stability in a PLL is desired. While CMOS processing technology is employed to fabricate the PLLs in the preferred embodiments, other suitable processing technologies, such as bipolar and BiCMOS, may be also used to implement PLLs in the preferred embodiments.

Figure 1:
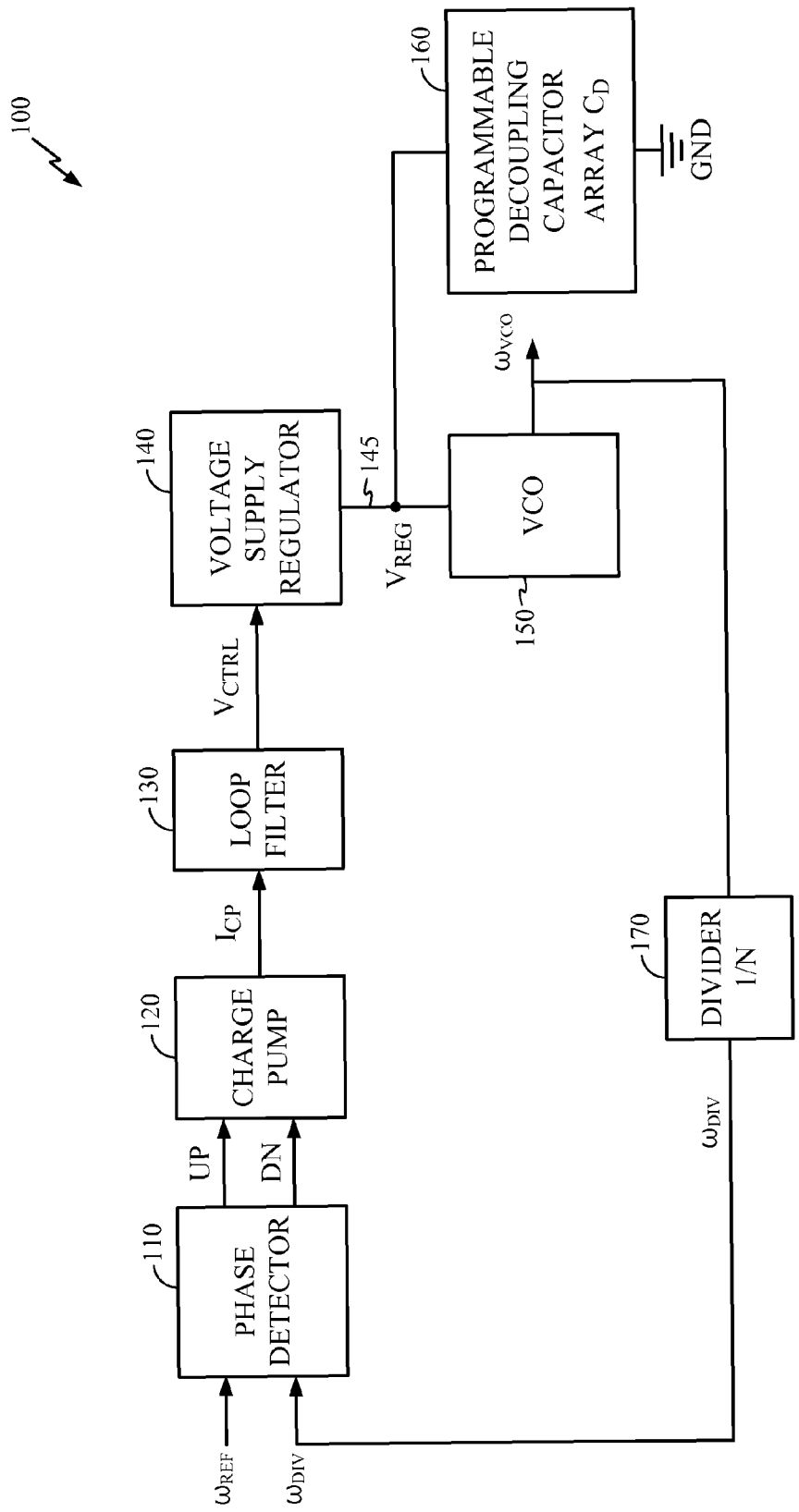
FIG. 1 illustrates a block diagram of a supply-regulated PLL of an illustrative embodiment.

FIG. 1 illustrates a block diagram of supply-regulated PLL 100 in accordance with an embodiment of the present invention. PLL 100 comprises phase detector 110, charge pump 120, loop filter 130, supply voltage regulator 140, voltage controlled oscillator (VCO) 150, programmable decoupling capacitor array 160, and feedback divide-by-N circuit 170. The phase detector 110 compares the phase and frequency of a reference signal, such as an input clock signal $\omega_{REF}$ to the phase and frequency of an oscillatory feedback signal $\omega_{DIV}$ generated by the divide-by-N circuit 170 in response to a PLL output frequency signal $\omega_{VCO}$. The phase detector 110 generates an output signal indicating the phase difference between reference signal $\omega_{REF}$ and feedback signal $\omega_{DIV}$. In an embodiment, an up (UP) or a down (DN) signal is produced when the feedback signal $\omega_{DIV}$ lags or leads the reference signal $\omega_{REF}$. The UP and DN signals from phase detector 110 are fed into charge pump 120 that can produce a control signal to effectively alter the output frequency $\omega_{VCO}$ of VCO 150. The control signal generated from charge pump 120 can be a current signal $I_{CP}$ as shown or a voltage signal. As an example, charge pump 120 may be an existing charge pump comprising two switched current sources driving a capacitor, which can source or sink current on the capacitor according to the UP and DN signals and generates a control voltage signal. The UP signal adds an amount of charge to the capacitor proportional to the width of the UP signal pulse, while a pulse on the DN signal removes charge proportional to the DN pulse width. If the width of the UP is larger than that of the DN pulse, there is a net increase in the control voltage signal. Charge pump 120 having other configurations can also be used.

It is noted that, throughout the description of the preferred embodiments of the current invention, angular frequencies $\omega_{REF}$, $\omega_{VCO}$ and $\omega_{DIV}$ measured in radians per second are used to represent the frequencies of the PLL reference signal, the PLL output signal and the PLL feedback signal, respectively, for illustrative purpose only. The inventive features disclosed in the various embodiments also apply when ordinary frequency f measured in hertz is used to represent the frequencies of the various PLL signals in the various embodiments without departing from the scope of the current invention. An angular frequency and an ordinary frequency is related to each other through the equation of $\omega=2\pi f$.

Loop filter 130 is used to filter out the undesirable spectrum components of the control signal produced by charge pump 120. The spectral property of loop filter 130 is preferably a low-pass filter that extracts the DC component of the control signal from charge pump 120, providing an "AC-free" VCO control voltage signal $V_{CTRL}$ to supply voltage regulator 140. Various loop filters may be used for loop filter 130. In an embodiment, loop filter 130 is a known RC low-pass network. In another embodiment, loop filter 130 is a switched-capacitor loop filter. Loop filter 130 having other configurations can be also employed.

Supply voltage regulator 140 is coupled between loop filter 130 and VCO 150. It can amplify the filtered VCO control voltage signal $V_{CTRL}$ and outputs a variable or adjustable regulated VCO control voltage $V_{REG}$ on an output node 145. Supply voltage regulator 140 typically exhibits significantly improved power-supply rejection ratio (PSRR) and produces a regulated VCO control voltage $V_{REG}$ substantially free of noise, which is typically presented on DC power supply line $V_{DD}$ and substrate in an IC chip. Supply voltage regulator 140 also typically exhibits a low dropout voltage, allowing the regulated VCO control voltage $V_{REG}$ to be as high as possible, and thus, maximizing the attainable frequency of output frequency signal $\omega_{VCO}$ of VCO 150. Supply voltage regulator 140 can be implemented through various circuit configurations.

VCO 150 comprises an oscillator that is coupled to output node 145 of supply voltage regulator 140 and outputs a frequency signal $\omega_{VCO}$ in response to the regulated VCO control voltage $V_{REG}$. A divided version of VCO 150 output frequency signal $\omega_{VCO}$ (i.e., $\omega_{DIV}$) is fed back to the phase detector 110 through divide-by-N circuit 170, which has a multiplication factor of N. When there is a frequency difference between the reference signal $\omega_{REF}$ and feedback signal $\omega_{DIV}$, the value of the regulated VCO control voltage $V_{REG}$ will increase or decrease to speed up or slow down the VCO 150, causing the feedback signal $\omega_{DIV}$ to catch up with the reference signal $\omega_{REF}$ or to eliminate the lead of the feedback signal $\omega_{DIV}$. When an automatic follow-up between the reference signal $\omega_{REF}$ and the feedback signal $\omega_{DIV}$ is achieved, the VCO 150 output frequency signal $\omega_{VCO}$ is said to be locked on the reference signal $\omega_{REF}$. The VCO 150 preferably exhibits a linear voltage-frequency transfer characteristic between $V_{REG}$ and $\omega_{VCO}$.

Also illustrated in the block diagram of supply-regulated PLL 100 in FIG. 1 is programmable decoupling capacitor array 160. The decoupling capacitor array 160 is coupled between the supply voltage regulator output node 145 and an AC ground (GND), and provides a variable capacitance between $V_{REG}$ and GND. The decoupling capacitor array 160 may be a known programmable capacitor array of various configurations, and its capacitance may be varied through selectively connecting various ones of the capacitors in the array through known means, such as a known coding/decoding and multiplexing circuit.

With the PLL 100 configuration illustrated with respect to FIG. 1, a higher-order, non-dominant pole is generally introduced in the PLL 100 transfer function due to the addition of the supply-regulator 140 and the decoupling capacitor array 160 into the PLL 100 loop. The frequency of the higher-order, non-dominant pole can be generally expressed as the following:

$$\omega_D g_{vco}/C_D \qquad (1)$$

where $g_{vco}$ represents the effective transconductance of VCO 150 at node 145, and $C_D$ represents the capacitance of the programmable decoupling capacitor array 160 at node 145. Also, with the PLL 100 configuration illustrated with respect to FIG. 1, VCO 150 is configured having an oscillation frequency in a form expressed as the following:

$$\omega_{VCO} = g_{vco}/C_{EFF} \qquad (2)$$

where $C_{EFF}$ represents an effective capacitance of VCO 150. It is noted that various VCO 150 configurations exist to exhibit an oscillation frequency characteristic as described with respect to expression (2). The scope of the invention is not intended to be limited to any particular type of voltage-controlled oscillator.

In preferred embodiments, the capacitance $C_D$ of the decoupling capacitor array 160 is variable and adjustable so that its value is set to be proportional to the multiplication factor N of the divide-by-N circuit 170. When PLL 100 operates under a pre-determined multiplication factor N, the capacitance $C_D$ of programmable decoupling capacitor array 160 is set so that:

$$C_D = N \ast C_{UNIT} \qquad (3)$$

where $C_{UNIT}$ represents a unit capacitance characterized for an IC processing technology chosen for fabricating the capacitors in the decoupling capacitor array 160. This variable capacitance $C_D$ can be automatically adjusted through a control logic circuit (not shown), such as a coding-decoding and a multiplexing circuit that selects and connects various ones of a plurality of capacitors in the programmable capacitor array 160. When PLL 100 is reset to operate under a different multiplication factor N, which typically leads to a different VCO 150 output frequency signal $\omega_{VCO}$, the control logic circuit will reset the variable capacitance $C_D$ of expression (3) according to the adjusted multiplication factor N of divide-by-N circuit 170. As an example, in an initial PLL 100 setup where the frequency of the reference signal $f_{REF}$ is 10 MHz ($\omega_{REF} = 2\pi f_{REF}$) and the frequency of the VCO 150 output frequency signal $f_{VCO}$ is 900 MHz ($\omega_{VCO} = 2\pi f_{VCO}$), i.e. N=90, $C_D$ is set to be 90 times $C_{UNIT}$. When PLL 100 is reset to generate an VCO 150 output frequency signal $f_{VCO}$ of 1.0 GHz in response to the same reference signal, i.e., N=100, $C_D$ is reset to be 100 times $C_{UNIT}$. The reset of N and $C_D$ on PLL 100 can be performed simultaneously through a common control logic circuit. The reset of N and $C_D$ on PLL 100 may be also performed sequentially and through separate control logic circuits.

With the PLL 100 configuration described above, the ratio of the high-order pole frequency $\omega_D$ to the frequency of the reference signal $\omega_{REF}$ can be deducted from expressions (1), (2) and (3) as the following:

$$\omega_D/\omega_{REF} = (g_{vco}/C_D)/\omega_{REF} = g_{vco}/(\omega_{REF} \ast N \ast C_{UNIT}) = g_{vco}/(\omega_{VCO} \ast C_{UNIT}) = C_{EFF}/C_{UNIT} \qquad (4)$$

Advantageous features of PLL 100 can be readily appreciated from expression (4) as at least the following. First, the ratio of the high-order pole frequency $\omega_D$ to the frequency of the reference signal $\omega_{REF}$ is independent from the multiplication factor N of divide-by-N circuit 170. In other word, within its frequency locking range, the loop dynamics of PLL 100 (e.g., pole frequency) always tracks the frequency of the reference signal $\omega_{REF}$ when PLL 100 operates between different frequency bands. As a result, the operational stability of PLL 100 can be significantly improved. Second, expression (4) indicates that the ratio of the high-order pole frequency $\omega_D$ to the frequency of the reference signal $\omega_{REF}$ in PLL 100 is equal to the ratio of the VCO 150 effective capacitance $C_{EFF}$ to the unit capacitance $C_{UNIT}$, both being significantly less sensitive to PVT variations when compared with other circuit/device parameters. In consequence, the operational stability of PLL 100 is substantially immune to PVT variations as desirable for advanced PLL structures.

Figure 2:
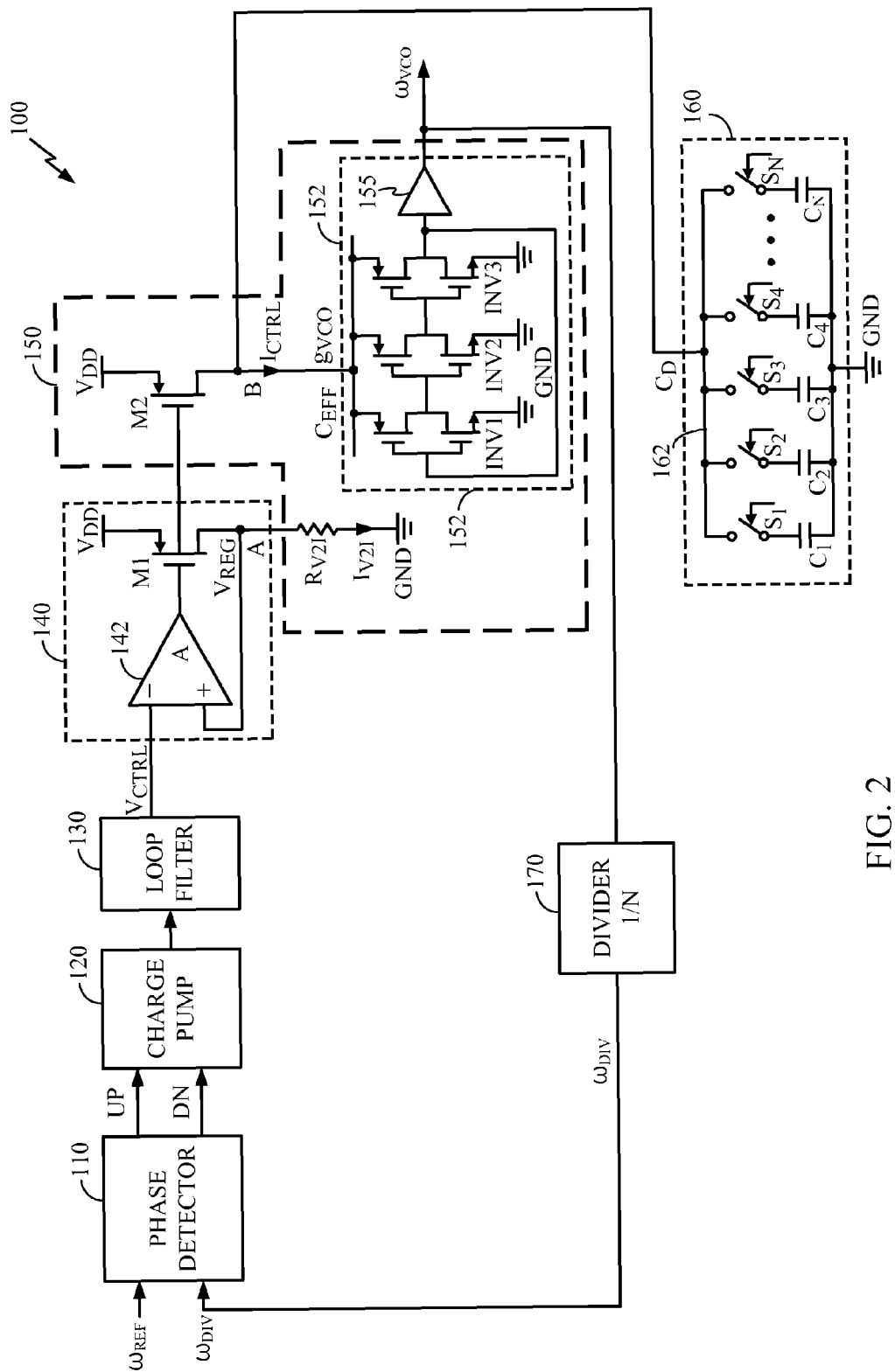
FIG. 2 illustrates an exemplary schematic diagram of a supply-regulator, voltage-controlled oscillator, and programmable decoupling capacitor array of a supply-regulated PLL of an illustrative embodiment.

FIG. 2 illustrates supply-regulated PLL 100 wherein an exemplary schematic diagram of supply voltage regulator 140, VCO 150, and programmable decoupling capacitor array 160 are shown as being implemented with, among others, operational amplifier (op-amp) 142 and PMOSFET M1, voltage-to-current (V2I) resistor $R_{V2I}$ and PMOSFET M2 and ring oscillator 152, and switched-capacitor array 162, respectively. The control voltage signal $V_{CTRL}$ from loop filter 130 is supplied to a differential input of op-amp 142 whose output is coupled to a gate of PMOSFET M1. The source of PMOSFET M1 is coupled to the power supply $V_{DD}$ and the drain of PMOSFET M1 is coupled to node A. The voltage $V_{REG}$ at node A is fed back to the other differential input of op-amp 142, forming a local feedback loop. This local feedback loop is also typically referred to as a supply-regulating loop. Compared to the "noisy" power supply voltage $V_{DD}$, the voltage $V_{REG}$ at node A is regulated by the supply-regulating loop such that noise from the power supply $V_{DD}$ creates a local corrective voltage cancelling out the noise. As a result, $V_{REG}$ remains substantially constant while $V_{DD}$ varies. $V_{REG}$ is also commonly referred to as supply-regulated voltage. As described previously, the addition of the supply-regulating loop in the forward path of PLL 100 creates the higher-order, non-dominant pole in the transfer function of PLL 100 with a frequency $\omega_D$ expressed with respect to expression (1).

VCO 150 comprises V2I resistor $R_{V2I}$ that is implemented between node A and GND to convert the supply-regulated voltage $V_{REG}$ into a dc current $I_{V2I}$. VCO 150 also comprises PMOSFET M2 that is implemented in the forward path after PMOSFET M1. PMOSFET M2 may be identical with PMOSFET M1. The source of PMOSFET M2 is coupled to the power supply $V_{DD}$ and the drain of PMOSFET M2 is coupled to node B. The gate of PMOSFET M2 is coupled to the gate of PMOSFET M1. With this current mirror circuit configuration, a dc current $I_{CTRL}$ is generated in the PMOSFET M2 branch and flows into node B. $I_{CTRL}$ thus created may be a precise copy of the dc current $I_{V2I}$, substantially immune from the noise in supply voltage $V_{DD}$. $I_{CTRL}$ is subsequently fed into ring oscillator 152 and converted into output frequency signal $\omega_{VCO}$ of PLL 100.

In the current configuration, ring oscillator 152 is implemented using a CMOS process technology, and comprises a chain of three CMOS inverters INV1 through INV3. The sources of the PMOSFETs of inverters INV1 through INV3 are coupled to node B. The sources of the NMOSFETs of inverters INV1 through INV3 are coupled to GND. The voltage at the output stage of INV3 is fed back to the input stage of INV1. Ring oscillator 152 also comprises a "level up" unit 155, which is configured to convert the voltage differences between the inverters into an output frequency signal $\omega_{VCO}$ at the output node of "level up" unit 155. Similarly, the output frequency signal $\omega_{VCO}$ of ring oscillator 152 can be expressed as the ratio of the effective transconductance $g_{vco}$ of ring oscillator 152 to the effective capacitance $C_{EFF}$ of ring oscillator 152, as described previously with respect to expression (2).

It is noted that, although ring oscillator 152 is illustrated to generate output frequency signal $\omega_{VCO}$, current-controlled oscillator (CCO) having other configurations can be also used to convert the dc current $I_{CTRL}$ into output frequency signal $\omega_{VCO}$. The schematic diagram of ring oscillator 152 illustrated in FIG. 2 is not intended to limit the CCO to any particular type.

It is also noted that V2I resistor $R_{V2I}$ and PMOSFET M2 are described as V2I converter for illustrative purpose only. Other V2I circuit configuration can also be used to create an accurate CCO control current signal $I_{CTRL}$ in response to the supply-regulated voltage $V_{REG}$. It is further noted that V2I resistor $R_{V2I}$ and PMOSFET M2 are described as a portion of VCO 150 for illustrative purpose only. V2I circuits used to convert the supply-regulated voltage $V_{REG}$ into CCO control current signal $I_{CTRL}$ may be also implemented as a portion of other circuit components of PLL 100, such as a portion of supply voltage regulator 140, or as a separate circuit component. The scope of the invention is not intended to limit the V2I circuit to any particular circuit type or configuration.

FIG. 2 also illustrates programmable VCO decoupling capacitor array 162. The programmable decoupling capacitor array 162 comprises a plurality of capacitors implemented in parallel between node B and GND. A capacitor $C_i$ (i=1, 2, ..., N) may be selectively coupled to node B and GND by closing switch $S_i$. The total capacitance $C_D$ of programmable decoupling capacitor array 162 is equal to the summation of the capacitance of the capacitors coupled to node B and GND with a pre-determined switching scheme that determines which switches to close and which switches to open for obtaining a desired $C_D$. For a PLL 100 setting in which the multiplication factor of divide-by-N circuit 170 is set to have a pre-determined value of N, the total capacitance $C_D$ of programmable decoupling capacitor array 162 is set to be $C_D=N*C_{UNIT}$ as described previously by expression (3), where $C_{UNIT}$ represents a unit capacitance characterized for an IC processing technology chosen for fabricating the capacitors in the decoupling capacitor array $C_D$. When the multiplication factor of divide-by-N circuit 170 is reset to another value for a different PLL 100 setting, the total capacitance $C_D$ of capacitor array 162 is adjusted according to the reset multiplication factor value.

In an exemplary PLL 100 configuration, divide-by-N circuit 170 is configured to have a maximum multiplication factor $N_{max}$ of 1000 and a minimum multiplication factor $N_{min}$ of 80. The programmable decoupling capacitor array 162 comprises 1000 identical switched-capacitors, each having a capacitance equal to the unit capacitance $C_{UNIT}$. When the exemplary PLL 100 is set to operate with a divide-by-N circuit 170 multiplication factor of 1000, switches in programmable decoupling capacitor array 162 are all closed; the total capacitance $C_D$ of capacitor array 162 is equal to $1000*C_{UNIT}$. When the exemplary PLL 100 is reset to operate with a divide-by-N circuit 170 multiplication factor of 80, only eighty out of the one thousand switches are closed so that the total capacitance $C_D$ of capacitor array 162 is reset to be equal to $80*C_{UNIT}$. Known control logics (not shown) can be used to selectively open and close the various ones of the switches in the capacitor array 162, and to selectively coupling the various ones of the capacitors to node B and GND.

Various known circuits, devices, components may be implemented as a switch $S_i$ described above for connecting or disconnecting a capacitor in programmable decoupling capacitor array 162. The scope of the invention is not intended to limit the switch to any particular type or configuration.

In another exemplary PLL 100 configuration, divide-by-N circuit 170 is configured to have a fractional-N divide-by-N circuit architecture in an effort to improve phase noise, for example. Fractional-N divide-by-N circuit architecture has a fractional multiplication factor and allows a VCO output frequency resolution to be a fractional portion of the reference frequency $\omega_{REF}$. The capacitance $C_D$ of programmable decoupling capacitor array 162 can be adjusted according to the current value of fractional multiplication factor N in a similar manner as that of the exemplary PLL 100 having an integer-N divided-by-N circuit.

Advantageous features include that, when PLL 100 is set to operate from one divide-by-N circuit 170 multiplication factor to another, integer or fractional, the total capacitance $C_D$ of programmable decoupling capacitor array 162 can be automatically adjusted according to the current multiplication factor. As a result, the ratio of the pole frequency $\omega_D$ of the high-order pole created by supply-regulating loop 140 to reference signal frequency $\omega_{REF}$ is always independent of divide-by-N circuit 170 multiplication factor N, as explained previously with respect to expression (4). This circuit characteristic can lead to significantly improved PLL 100 operational stability as can be appreciated by those skilled in the art. Moreover, the ratio of $\omega_D$ to $\omega_{REF}$ is equal to the quotient of the VCO 152 effective capacitance $C_{EFF}$ and the processing technology unit capacitance $C_{UNIT}$, as expressed in equation (4). Such quotient is the ratio of two capacitances, which is typically insensitive to PVT variations. As a result, the improved operational stability of PLL 100 is generally immune from PVT variations. As an additional advantageous feature, complex compensation circuits for the pole may be simplified or eliminated due to the improved PLL operational stability. As a result, PLLs with the inventive features may lead to lowered power consumption and reduced chip footprint.

It is noted that the programmable decoupling capacitor array 162 is shown to provide an adjustable capacitance $C_D$ according to a current multiplication factor N value of divide-by-N circuit for illustrative purpose only. Those skilled in the art shall realize that any decoupling capacitance can be used in place of capacitor array 162 so long as its capacitance can be controlled and adjusted with a desired resolution according to a current multiplication factor N, integer or fractional. The scope of the invention is not intended to limit the adjustable decoupling capacitance to any particular type or configuration.

It is also noted that supply-regulated PLL 100 can be partitioned into a digital domain and an analog domain. The circuit modules in supply-regulated PLL 100 illustrated above can be both analog and digital circuit modules. For example, the analog domain may include phase detector 110, charge pump 120, loop filter 130, and VCO 150. The digital domain may include divide-by-N circuit 170 that comprises an asynchronous high speed feedback divider. Moreover, circuitry in the digital domain may be powered by a digital voltage supply. In contrast, some circuitry in the analog domain may be power by an analog supply, such as the charge pump and the current mirror, while the rest may be powered by a digital supply power, such as phase detector 110. The analog voltage supply may be larger or smaller than the digital voltage supply.

It is further noted that supply-regulated PLL 100 described above only illustrates those circuit modules applicable for demonstrating the inventive features. Supply-regulated PLL 100 may also include additional circuitry that is implemented to achieve a pre-determined PLL characteristic. The additional circuitry may include pre-divider, loop filter clocking logic, no-clock detector, post-divider, multiplication factor N selection circuit, output buffers, for example. Any number of additional circuits, devices, components, connectors, and the like may be implemented with PLL 100. The specific circuits or lack of circuits that may be illustrated herein are not intended to limit the embodiments of the present invention in any way.

Figure 3:
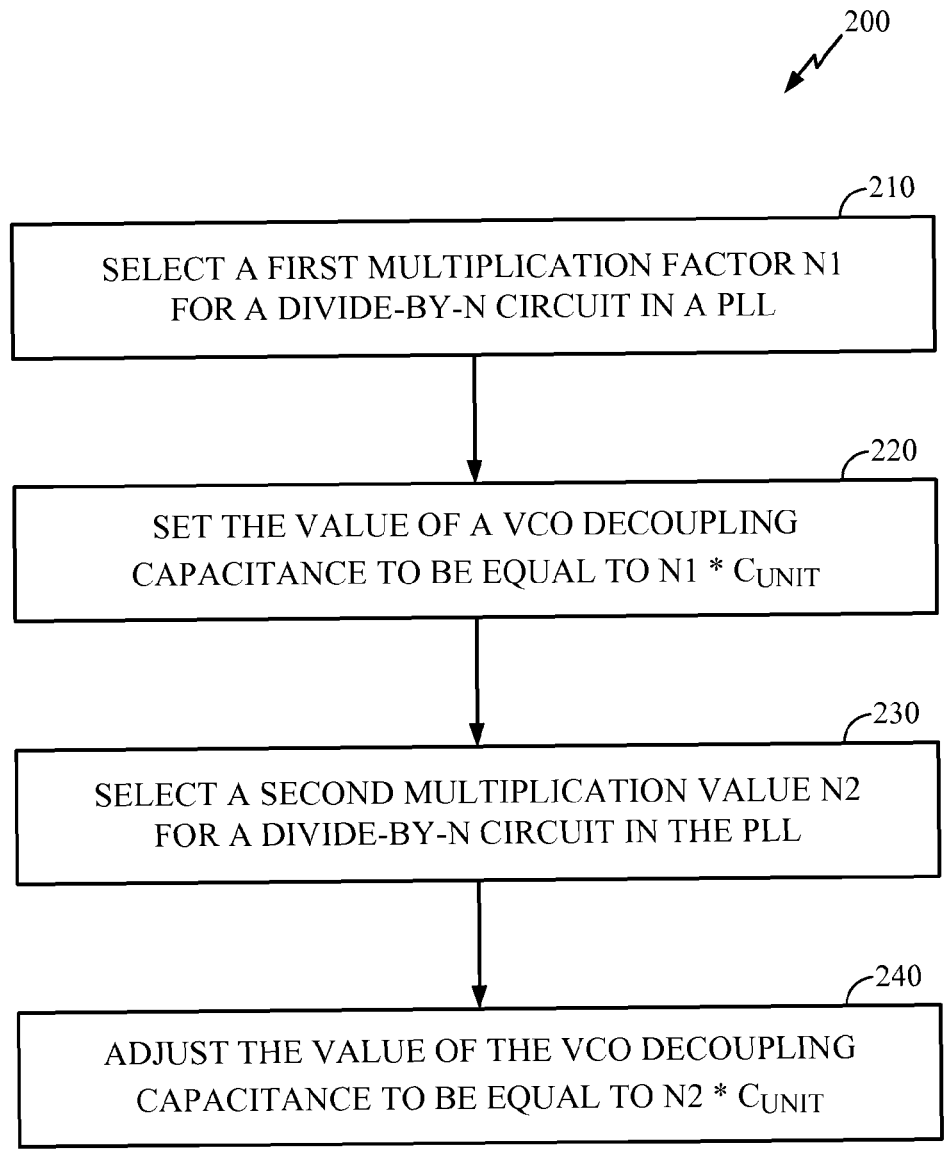
FIG. 3 is a flow diagram illustrating a method of using a supply-regulated PLL of an illustrative embodiment.

FIG. 3 is a flow diagram 200 illustrating a method of using supply-regulated PLL 100. The method may be performed by selecting 210 a first multiplication factor N1 for a divide-by-N circuit in supply-regulated PLL 100. This may set a VCO in supply-regulated PLL100 to operate in a first frequency band. The divide-by-N circuit may comprise a multiplication factor N selecting circuit that is configured to adjust its N value in response to an incoming control signal. The multiplication factor N1 may be integer or fractional, depending on the application of supply-regulated PLL 100. The value of the VCO decoupling capacitance $C_D$ is set 220 to be equal to N1*$C_{UNIT}$, where $C_{UNIT}$ represents a unit capacitance characterized for an IC processing technology chosen for fabricating the decoupling capacitor. The decoupling capacitor may be a programmable decoupling capacitor array with a plurality of switched capacitors. A desired value of the programmable decoupling capacitance $C_D$ may be obtained through selectively connecting the various ones of the capacitors in the array by known means, such as a known coding-decoding circuitry and a known multiplexing circuitry. Other variable capacitor having a desired adjusting resolution in the tuning range of the multiplication factor N can be also used as the VCO decoupling capacitor $C_D$. The method may be further performed by selecting 230 a second multiplication factor N2 for the divide-by-N circuit in supply-regulated PLL 100. The multiplication factor N2 may be integer or fractional, larger or smaller than N1, depending on the application of supply-regulated PLL 100. The selection of N2 in the divide-by-N circuit may be performed in a similar manner used above for selecting N1. This may switch the VCO in PLL100 to operate from a first frequency band to a second frequency band. The value of the VCO decoupling capacitor $C_D$ is then adjusted 240 to be equal to N2*$C_{UNIT}$ in a similar manner as that described above in setting the previous decoupling capacitance value.

It is noted that selecting 210 the first multiplication factor N1 and setting 220 the VCO decoupling capacitance may be performed simultaneously during a PLL 100 initialization process. Similarly, selecting 230 the second multiplication factor N2 and adjusting 240 the VCO decoupling capacitance may be performed simultaneously during a subsequent PLL 100 reset process when PLL 100 is ready to be switched from a first frequency band to a second frequency band.

Figure 3A:
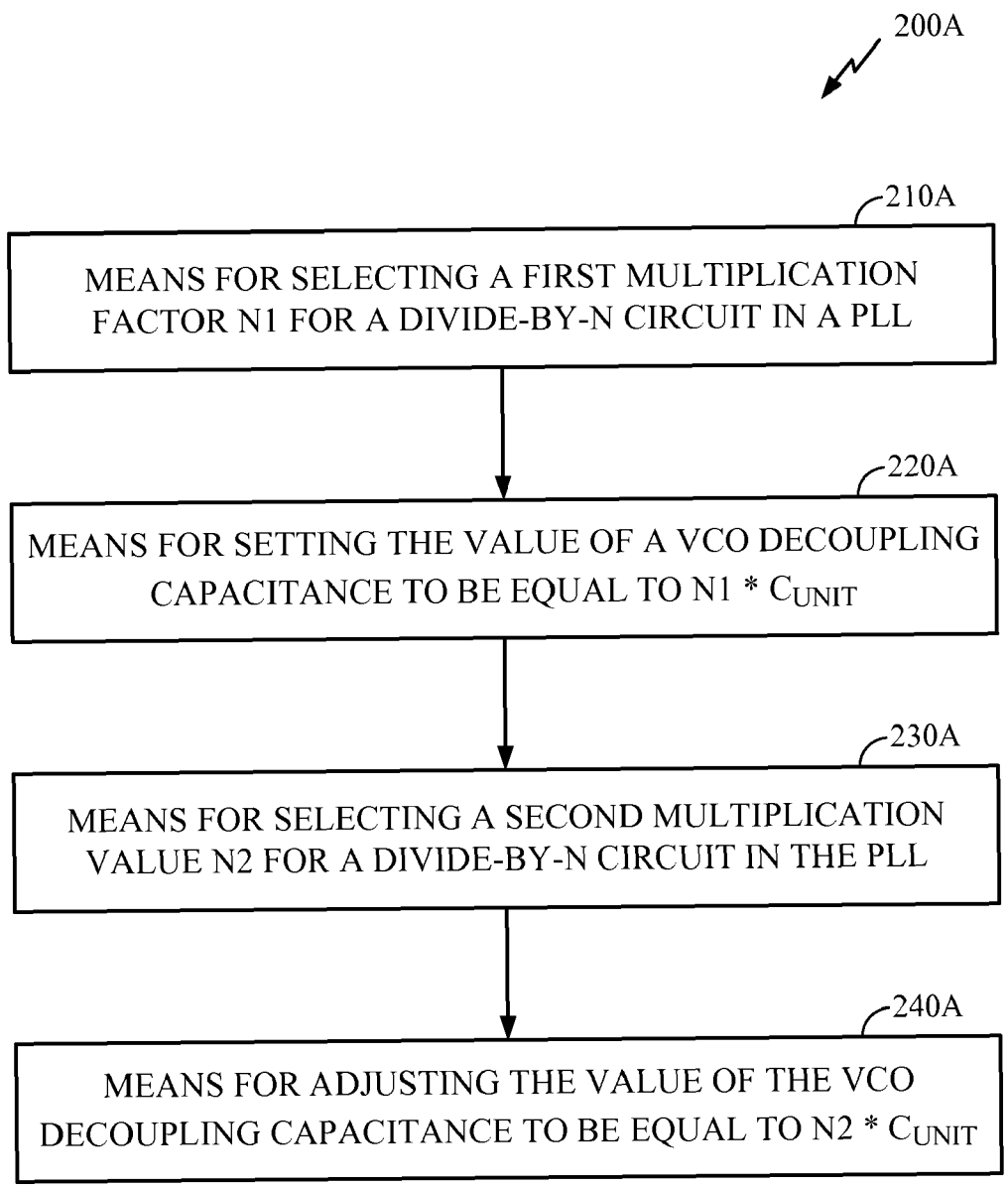
FIG. 3A illustrates means-plus-function blocks corresponding to the method of FIG. 3.

The method 200 of FIG. 3 describes above may be performed by various hardware and/or software components and/or modules corresponding to the means-plus-function blocks 200A illustrated in FIG. 3A. In other words, blocks 210 through 240 illustrated in FIG. 3 correspond to means-plus-function blocks 210A through 240A illustrated in FIG. 3A.

Figure 4:
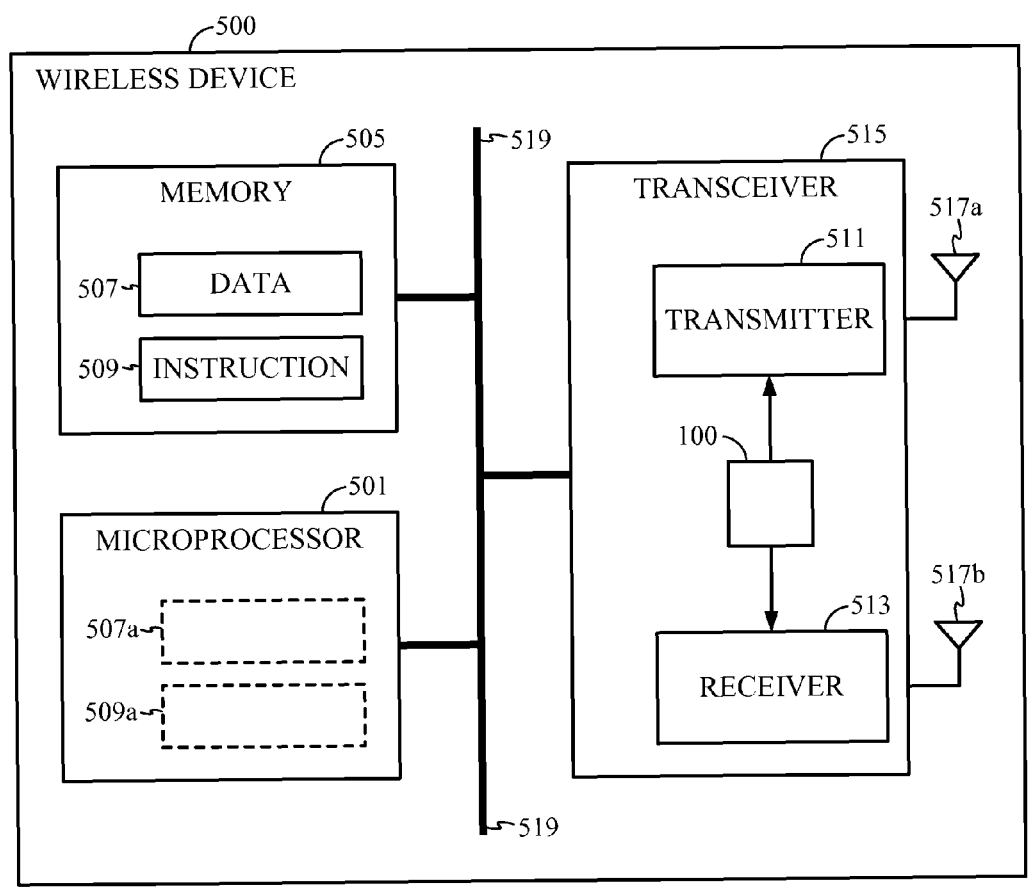
FIG. 4 illustrates certain components that may be included with a supply-regulated PLL of an illustrative embodiment within a wireless device.

FIG. 4 illustrates that supply-regulated PLL 100 may be included within a wireless device 500. Wireless device 500 may be a mobile device/station or a base station, i.e., an access point. Examples of mobile stations include cellular phones, handheld wireless devices, wireless modems, laptop computers, personal computers, etc. A mobile station may alternatively be referred to as an access terminal, a mobile terminal, a subscriber station, a remote station, a user terminal, a terminal, a subscriber unit, user equipment, etc. The supply-regulated PLL 100 and method of using may be part of a wireless device 500. As an example, supply-regulated PLL 100 may be a portion of a frequency synthesizer that is implemented to form a local oscillator. The local oscillator included with wireless device 500 may be used to modulate a baseband signal in a transmitter and demodulate an incoming RF signal in a receiver. Additionally, supply-regulated PLL 100 and method of using may be in an electronic device that is not a wireless device 500. However, the electronic device block diagram and components would be similar to the wireless device 500 of FIG. 4 except that supply-regulated PLL 100 may not be a portion of a transceiver 515.

The wireless device 500 may include a microprocessor 501. The microprocessor 501 may be a general purpose single- or multi-chip microprocessor (e.g., an embedded ARM processor), a special purpose microprocessor (e.g., a digital signal processor (DSP)), a microcontroller, a programmable gate array, etc. The processor 501 may be referred to as a central processing unit (CPU). Although just a single processor 501 is shown in the wireless device 500 of FIG. 4, in an alternative configuration, a combination of processors (e.g., an ARM and DSP) could be used.

The wireless device 500 also includes memory 505. The memory 505 may be any electronic component capable of storing electronic information. The memory 505 may be embodied as random access memory (RAM), read only memory (ROM), magnetic disk storage media, optical storage media, flash memory devices in RAM, on-board memory included with the processor, EPROM memory, EEPROM memory, registers, and so forth, including combinations thereof.

Data 507 and instructions 509 may be stored in the memory 505. The instructions 509 may be executable by the processor 501 to implement the methods disclosed herein. Executing the instructions 509 may involve the use of the data 507 that is stored in the memory 505. When the processor 501 executes the instructions 509, various portions of the instructions 509a may be loaded onto the processor 501, and various pieces of data 507a may be loaded onto the processor 501.

The wireless device 500 may also include a transmitter 511 and a receiver 513 to allow transmission and reception of signals to and from the wireless device 500. The transmitter 511 and receiver 513 may be collectively referred to as a transceiver 515. An antenna 517 may be electrically coupled to the transceiver 515. The wireless device 500 may also include (not shown) multiple transmitters, multiple receivers, multiple transceivers and/or multiple antenna (e.g., 517a, 517b).

The various components of the wireless device 500 may be coupled together by one or more buses, which may include a power bus, a control signal bus, a status signal bus, a data bus, etc. For the sake of clarity, the various buses are illustrated in FIG. 4 as a bus system 519.

In the above description, reference numbers have sometimes been used in connection with various terms. Where a term is used in connection with a reference number, this is meant to refer to a specific element that is shown in one or more of the Figures. Where a term is used without a reference number, this is meant to refer generally to the term without limitation to any particular Figure.

The term "determining" used previously encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" "code" may comprise a single computer-readable statement or many computer-readable statements.

The functions described herein may be implemented in hardware, software, firmware, or any combination thereof. If implemented in software, the functions may be stored as one or more instructions on a computer-readable medium. The term "computer-readable medium" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A phase-locked loop (PLL) circuit comprising:
a supply regulator configured to generate a regulated control voltage to a voltage-controlled oscillator (VCO), the VCO generating a VCO output frequency in response to the regulated control voltage;
a divide-by-N circuit configured to feedback a divided portion of the VCO output frequency to a phase detector, the divide-by-N circuit having a multiplication factor of N; and
a decoupling capacitor coupled to the regulated control voltage, the capacitance of the decoupling capacitor being equal to N times $C_{UNIT}$, wherein $C_{UNIT}$ represents a unit capacitance characterized for a processing technology chosen for fabricating the decoupling capacitance.

2. The PLL circuit of claim 1, wherein the VCO comprises a current-controlled oscillator, and wherein the VCO output frequency is equal to the ratio of a transconductance of the current-controlled oscillator to an effective capacitance of the current-controlled oscillator.

3. The PLL circuit of claim 1, wherein the VCO comprises a voltage-to-current (V2I) circuit, the V2I circuit converting the regulated control voltage to a supply current to a current-controlled oscillator.

4. The PLL circuit of claim 3, wherein the current-controlled oscillator is a ring oscillator.

5. The PLL circuit of claim 1, wherein the multiplication factor N of the divide-by-N circuit is selected from a group consisting of an integer and a fractional number.

6. The PLL circuit of claim 1, wherein the decoupling capacitor comprises a programmable capacitor array, the capacitance of the programmable capacitor array being set through selectively connecting at least one of a plurality of capacitors in the programmable capacitor array.

7. The PLL circuit of claim 1, wherein the supply regulator comprises an operational amplifier (op-amp) and a PMOSFET, the op-amp having a first input coupled to a control voltage signal from a loop filer, an output coupled to a gate of the PMOSFET, and a second input coupled to the drain of the PMOSFET, and wherein the regulated control voltage is provided at the drain of the PMOSFET.

8. A supply-regulated phase-locked loop (PLL) circuit comprising:
a supply-regulated loop configured to generate a regulated supply voltage at a first node;
a voltage-to-current unit configured to generate a control current at a second node in response to the regulated supply voltage;
a current-controlled oscillator configured to generate an output frequency signal in response to the control current;
a divide-by-N circuit configured to feedback a divided portion of the output frequency signal to a phase detector, the divide-by-N circuit having a multiplication factor of N; and
a decoupling capacitor coupled between the second node and a ground, the capacitance of the decoupling capacitor being equal to N times $C_{UNIT}$, wherein $C_{UNIT}$ represents a unit capacitance characterized for a processing technology chosen for fabricating the decoupling capacitance.

9. The PLL circuit of claim 8, wherein the frequency of the output frequency signal is equal to the ratio of a transconductance of the current-controlled oscillator to an effective capacitance of the current-controlled oscillator.

10. The PLL circuit of claim 9, wherein the current-controlled oscillator is a ring oscillator.

11. The PLL circuit of claim 8, wherein the multiplication factor N of the divide-by-N circuit is selected from a group consisting of an integer and a fractional number.

12. The PLL circuit of claim 8, wherein the decoupling capacitor comprises a programmable capacitor array, the capacitance of the programmable capacitor array being set through selectively connecting at least one of a plurality of capacitors in the programmable capacitor array.

13. The PLL circuit of claim 12, wherein the selectively connecting at least one of the plurality of capacitors in the programmable capacitor array is at least performed through closing a switch connected to the at least one of the plurality of capacitors.

14. The PLL of claim 8, wherein the supply-regulated loop comprises an operational amplifier (op-amp) having an output coupled to a gate of PMOSFET, wherein a first input of the op-amp is coupled to a voltage control signal from a loop filter, and wherein a second input of the op-amp and a drain of the PMOSFET are coupled to the first node.

15. A method of using a phase-locked loop (PLL) circuit comprising:
selecting a first multiplication factor N1 for a divide-by-N circuit in the PLL;
setting the capacitance of a decoupling capacitor for a voltage controlled oscillator (VCO) to be equal to N1 times $C_{UNIT}$;
selecting a second multiplication factor N2 for a divide-by-N circuit in the PLL; and
adjusting the capacitance of the decoupling capacitor for the VCO to be equal to N2 times $C_{UNIT}$;
wherein $C_{UNIT}$ represents a unit capacitance characterized for a processing technology chosen for fabricating the decoupling capacitance.

16. The method of claim 15, wherein the decoupling capacitor comprises a programmable capacitor array, and wherein the programmable capacitor array comprise a plurality of switched-capacitors coupled between a regulated control voltage node and ground.

17. The method of claim 15, wherein the setting and adjusting comprises selectively closing a first plurality of switched capacitors and a second plurality of switch capacitors in the programmable capacitor array, respectively.

18. The method of claim 15, wherein the first multiplication factor N1 and the second multiplication factor N2 is selected from a group consisting of an integer and a fractional number, respectively.

19. The method of claim 15 wherein the VCO comprises a ring oscillator.

20. The method of claim 15, wherein the selecting the first multiplication factor N1 and the setting are performed in a PLL initialization process, and wherein the selecting the second multiplication factor N2 and the adjusting are performed in a PLL reset process.

21. A supply-regulated phase-locked loop (PLL) circuit comprising:
   means for selecting a first multiplication factor N1 for a divide-by-N circuit in the PLL;
   means for setting the capacitance of a decoupling capacitor for a voltage controlled oscillator (VCO) to be equal to N1 times $C_{UNIT}$;
   means for selecting a second multiplication factor N2 for a divide-by-N circuit in the PLL; and
   means for adjusting the capacitance of the decoupling capacitor for the VCO to be equal to N2 times $C_{UNIT}$;
   wherein $C_{UNIT}$ represents a unit capacitance characterized for a processing technology chosen for fabricating the decoupling capacitance.

22. The PLL circuit of claim 21, wherein the means for selecting the first multiplication factor N1 and the means for selecting the second multiplication factor N2 comprises a digital control logic, and wherein the digital control logic sets a pre-determined multiplication factor value according to an incoming digital control signal.

23. The PLL circuit of claim 22, wherein the first multiplication factor N1 and the second multiplication factor N2 is selected from a group consisting of an integer and a fractional number, respectively.

24. The PLL circuit of claim 21, wherein the decoupling capacitor comprises a programmable capacitor array, and wherein the programmable capacitor array comprise a plurality of switched-capacitors coupled between a regulated control voltage node and ground.

25. The PLL circuit of claim 24, wherein the means for setting and adjusting comprises a digital logic, and wherein the digital logic is configured to selectively close a first plurality of switched capacitors and a second plurality of switched capacitors in the programmable capacitor array according to a pre-determined scheme, respectively.

26. A wireless device configured to operate with a supply-regulated phase-locked loop (PLL) circuit, the wireless device comprising:
   a processor;
   memory in electronic communication with the processor;
   instructions stored in the memory, the instruction being executable by the processor to:
      select a first frequency band in the supply-regulated PLL;
      select a first multiplication factor N1 for a divide-by-N circuit in the PLL; and
      set the capacitance of a decoupling capacitor for a voltage controlled oscillator (VCO) to be equal to N1 times $C_{UNIT}$;
      wherein $C_{UNIT}$ represents a unit capacitance characterized for a processing technology chosen for fabricating the decoupling capacitance.

27. The wireless device of claim 26, wherein the instructions are further executable to:
   select a second frequency band in the supply-regulated PLL;
   select a second multiplication factor N2 for a divide-by-N circuit in the PLL; and
   adjust the capacitance of the decoupling capacitor for the VCO to be equal to N2 times $C_{UNIT}$.

28. The wireless device of claim 26, wherein the supply-regulated PLL circuit is configured to be a portion of a frequency synthesizer.

* * * * *